US011916579B2

(12) United States Patent
Wall, Jr.

(10) Patent No.: US 11,916,579 B2
(45) Date of Patent: Feb. 27, 2024

(54) HEAT TRANSFER IN OPTICAL TRANSCEIVER

(71) Applicant: Infinera Corporation, Sunnyvale, CA (US)

(72) Inventor: Franklin Wall, Jr., Vacaville, CA (US)

(73) Assignee: Infinera Corporation, San Jose, CA (US)

( * ) Notice: Subject to any disclaimer, the term of this patent is extended or adjusted under 35 U.S.C. 154(b) by 475 days.

(21) Appl. No.: 16/945,167

(22) Filed: Jul. 31, 2020

(65) Prior Publication Data

US 2021/0105025 A1 Apr. 8, 2021

Related U.S. Application Data

(60) Provisional application No. 62/912,145, filed on Oct. 8, 2019.

(51) Int. Cl.
*H04B 1/036* (2006.01)
*H04B 10/116* (2013.01)
*H05K 7/20* (2006.01)
*H04B 1/3827* (2015.01)
*H04B 10/43* (2013.01)

(52) U.S. Cl.
CPC ........... *H04B 1/036* (2013.01); *H04B 1/3827* (2013.01); *H04B 10/116* (2013.01); *H04B 10/43* (2013.01); *H05K 7/20409* (2013.01)

(58) Field of Classification Search
CPC .... H04B 1/036; H04B 1/3827; H04B 10/116; H04B 10/43; H05K 7/20409
USPC .......................................................... 398/125
See application file for complete search history.

(56) References Cited

U.S. PATENT DOCUMENTS

| 8,534,930 | B1 * | 9/2013 | Lima ..................... | G02B 6/4268 |
| | | | | 385/39 |
| 8,974,125 | B2 * | 3/2015 | McColloch ........... | H04B 10/40 |
| | | | | 361/676 |
| 9,668,379 | B1 * | 5/2017 | Bucher .............. | H05K 7/20436 |
| 10,091,911 | B2 * | 10/2018 | Kelty ................... | G02B 6/4269 |
| 10,555,437 | B2 * | 2/2020 | Little .................... | G02B 6/428 |
| 10,884,203 | B2 * | 1/2021 | Chanu ............... | H05K 7/20336 |
| 11,624,880 | B2 * | 4/2023 | Wall, Jr .............. | G02B 6/4246 |
| | | | | 439/367 |
| 2019/0025529 | A1 * | 1/2019 | Chen ....................... | G02B 6/35 |

(Continued)

FOREIGN PATENT DOCUMENTS

CA 2666014 A1 * 11/2010 ......... H05K 7/20545

OTHER PUBLICATIONS

Electronics meeting et al; Pluggable Optics Modules—Thermal Specifications; Jul. 2016; Electronics cooling; pp. 1-16. (Year: 2016).*

(Continued)

*Primary Examiner* — Amritbir K Sandhu
(74) *Attorney, Agent, or Firm* — David L. Soltz

(57) ABSTRACT

An optical transceiver with a built-in heat transfer structure is described. The heat transfer structure can connect one or more circuit regions of the optical transceiver to a heat sink while bypassing circuit regions that may impede the transfer of heat from the one or more circuit regions. The heat transfer structure may directly contact the one or more circuit regions, and the heat sink and may include an opening to avoid contact with the circuit regions to be bypassed.

13 Claims, 4 Drawing Sheets

(56) References Cited

U.S. PATENT DOCUMENTS

| | | | |
|---|---|---|---|
| 2019/0182985 A1* | 6/2019 | Gaviola | H05K 7/20409 |
| 2019/0190605 A1* | 6/2019 | Zhang | H04B 1/036 |
| 2019/0379417 A1* | 12/2019 | English | F25B 21/02 |
| 2021/0072472 A1* | 3/2021 | Curtis | G02B 6/4278 |
| 2021/0105025 A1* | 4/2021 | Wall, Jr. | H04B 1/3827 |

OTHER PUBLICATIONS

And Electronics meeting et al; Pluggable Optics Modules—Thermal Specifications; Jul. 2016; Electronics cooling; pp. 1-16. (Year: 2016).*

* cited by examiner

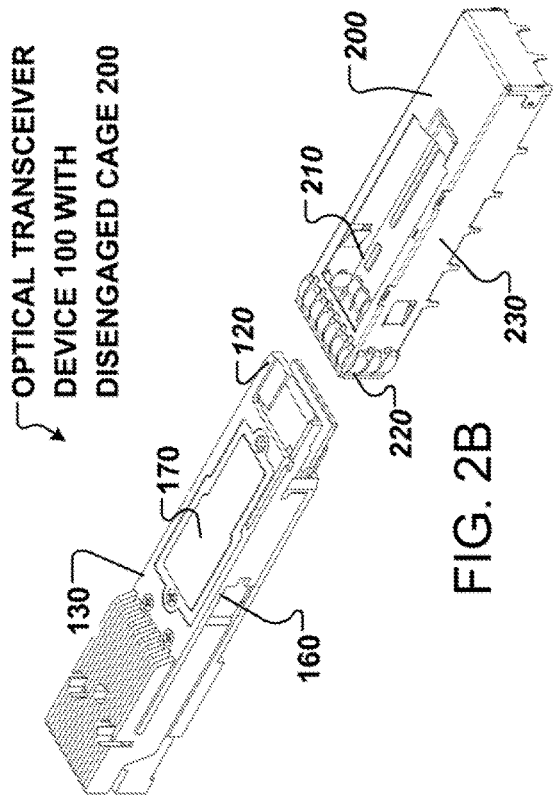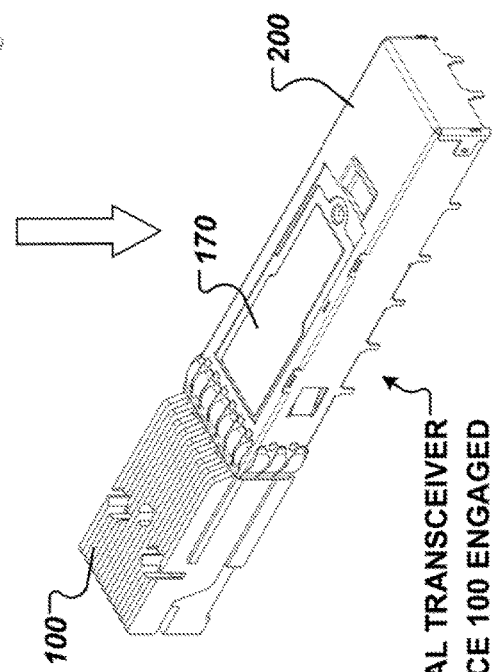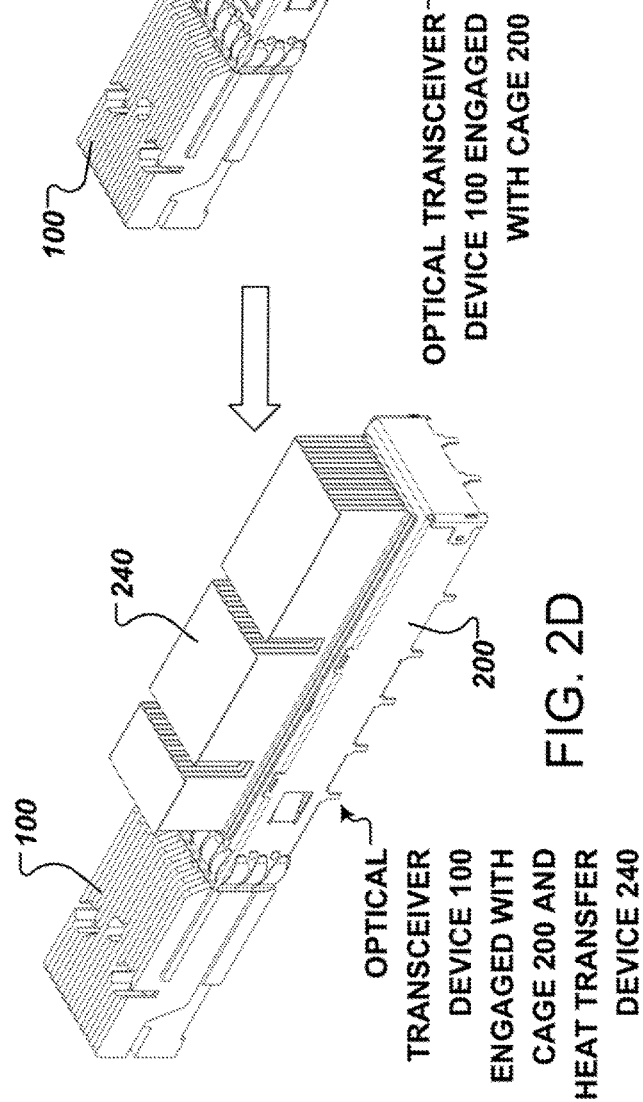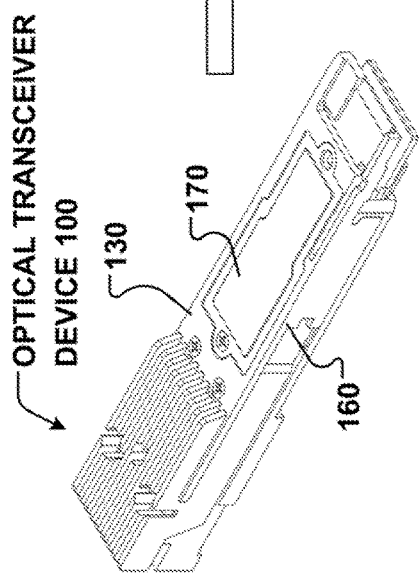

HEAT TRANSFER IN OPTICAL TRANSCEIVER

CROSS-REFERENCE TO RELATED APPLICATION

This application claims the benefit of U.S. Provisional Application No. 62/912,145, filed Oct. 8, 2019, which is incorporated herein by reference in its entirety.

FIELD

This specification generally relates to heat management in optical transceivers.

BACKGROUND

As optical systems become more compact and interconnected, heat management of the optical systems has become increasingly important. Ineffective heat management may damage circuits in the optical systems.

SUMMARY

This disclosure describes systems, methods, devices, and other implementations for improving heat transfer in optical transceivers.

An optical transceiver device may include various circuit regions that can generate heat, which, if not managed properly, may cause damage to the optical transceiver device. This disclosure describes a heat transfer structure that complements existing heat transfer devices such as fin structures and heat sinks and thereby may improve heat transfer capabilities in optical transceiver devices and systems. The heat transfer structure can connect one or more circuit regions to the heat sink while bypassing circuit regions that may impede the transfer of heat from the one or more circuit regions. The heat transfer structure may directly contact the one or more circuit regions and the heat sink and may include an opening to avoid contact with the circuit regions to be bypassed.

For example, according to some implementations, an apparatus for improving heat transfer includes a housing and a heat transport structure. The housing is configured to accommodate an optical transceiver in a first region of the housing and circuitry in a second region of the housing. The heat transport structure is located within the housing, and has a first section on which to mount the optical transceiver and a second section coupled to a heat sink. The heat transport structure includes an opening to accommodate the circuitry such that the circuitry is not in contact with the heat transport structure. The heat transport structure is also configured to transfer heat, generated by the optical transceiver, around the opening, to the second section.

In some implementations, a system that improves heat transfer includes a heat-transferring device, a network interface module and a thermally conductive structure. The heat-transferring device is configured to transfer heat away from one or more circuits. The network interface module is configured to be coupled to the heat-transferring device and includes a first circuit region and a second circuit region. The second circuit region is located between the first circuit region and the heat-transferring device. The thermally conductive structure is configured to be coupled to the first circuit region and to the heat-transferring device and configured to transfer heat from the first circuit region to the heat-transferring device without contacting the second circuit region.

In some implementations, a device for improving heat transfer includes a first circuit region, a second circuit region, and a thermally conductive structure. The first circuit region is proximate to a first end of the device. The second circuit region is proximate to a second end of the device that is configured to be engaged with a heat-transferring device. The thermally conductive structure is configured to be coupled to the first circuit region and the heat-transferring device. The thermally conductive structure is configured to transfer heat from the first circuit region to the heat-transferring device without transferring heat to and from the second circuit region in response to the device being engaged to the heat-transferring device.

In some implementations, a quad small form factor pluggable double density device (QSFP-DD) is coupled to a heat sink. The QSFP-DD includes a first circuit region, a second circuit region, and a graphite tape. The first circuit region is proximate to a first end of the QSFP-DD. The second circuit region includes a digital signal processing circuit and is proximate to a second end of the QSFP-DD that is configured to be directly connected to the heat sink. The second end is located on a side of the QSFP-DD that is on an opposite side to a side where the first end is located. The graphite tape is configured to transfer heat from the first circuit region to the heat sink without transferring heat to and from the second circuit region. The graphite tape includes a first portion, a second portion, and a pair of walls. The first portion is configured to transfer heat away from the first circuit region, which is located under the first portion. The second portion is configured to be coupled to the first portion and the heat sink such that in response to the QSFP-DD being directly coupled to the heat sink, the second portion is configured to transfer heat from the first portion to the heat sink. The pair of walls is configured to be disposed along the first circuit region and the second circuit region. The pair of walls connect the first portion to the heat sink such that a thermal connection of the graphite tape with the second circuit region is bypassed.

The heat transfer mechanism described in this disclosure can be advantageous in some implementations to provide an affordable, cost-effective solution to optimizing heat management in optical transceiver devices and systems. A heat transport structure can be configured based on the design of an optical transceiver device and can be designed to connect one or more regions of the optical transceiver device to a heat-transferring device such as a heat sink and to circumvent regions of the optical transceiver device that may impede heat transfer.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 2A, 2B, 2C, and 2D depict an example of an optical transceiver system in which an optical transceiver device is coupled to a heat-transferring device.

Like reference numbers and designations in the various drawings indicate like elements.

DETAILED DESCRIPTION

Optical transceiver devices can be used to connect electronic devices like network servers or switches to data transportation structures such as copper or fiber cables. As 5G technology continues to evolve and the market demands greater storage capabilities and higher speeds, it has become increasingly important that optical transceiver devices are designed to support faster speeds and larger data transfers while managing density, bandwidth, and thermal issues.

To facilitate thermal management optical transceiver devices may be coupled to a heat sink to provide relief from excess heat in regions of the optical transceiver, devices where circuits are deployed. However, this method of heat dissipation through the use of a heat sink may present several limitations. For example, the amount of heat dissipated may depend on ambient temperature and airflow. In addition, for optical transceiver devices with multiple regions of integrated circuits (ICs), heat generated from one region may spread to another region, thereby increasing the amount of heat in the other region. When heat spreads from one IC region to another, the heat dissipation effectiveness of the heat sink decreases considerably, leaving the optical transceiver device vulnerable to damage from excessive heat.

To address at least some of the foregoing issues, a heat transport structure is incorporated into an optical transceiver system such that heat is transferred from one IC region of an optical transceiver device to the heat sink without being affected by other IC regions of the optical transceiver device. The heat transport structure can be disposed on a housing of the optical transceiver device and can include at least two contact regions. One of these contact regions is in contact with, or coupled to, the heat sink, and the other contact region is in contact with, or coupled to, an IC region from which heat is to be transferred. The heat transport structure also may include one or more openings corresponding to other IC regions from which the heat transport structure is not configured to transfer heat. In this manner, heat can be transferred effectively from the desired IC region to the heat sink without interference from other IC chips in the optical transceiver device.

Additional details and benefits of the heat transferring mechanism used in optical transceiver systems and devices are described below with reference to the figures.

Figure 1:
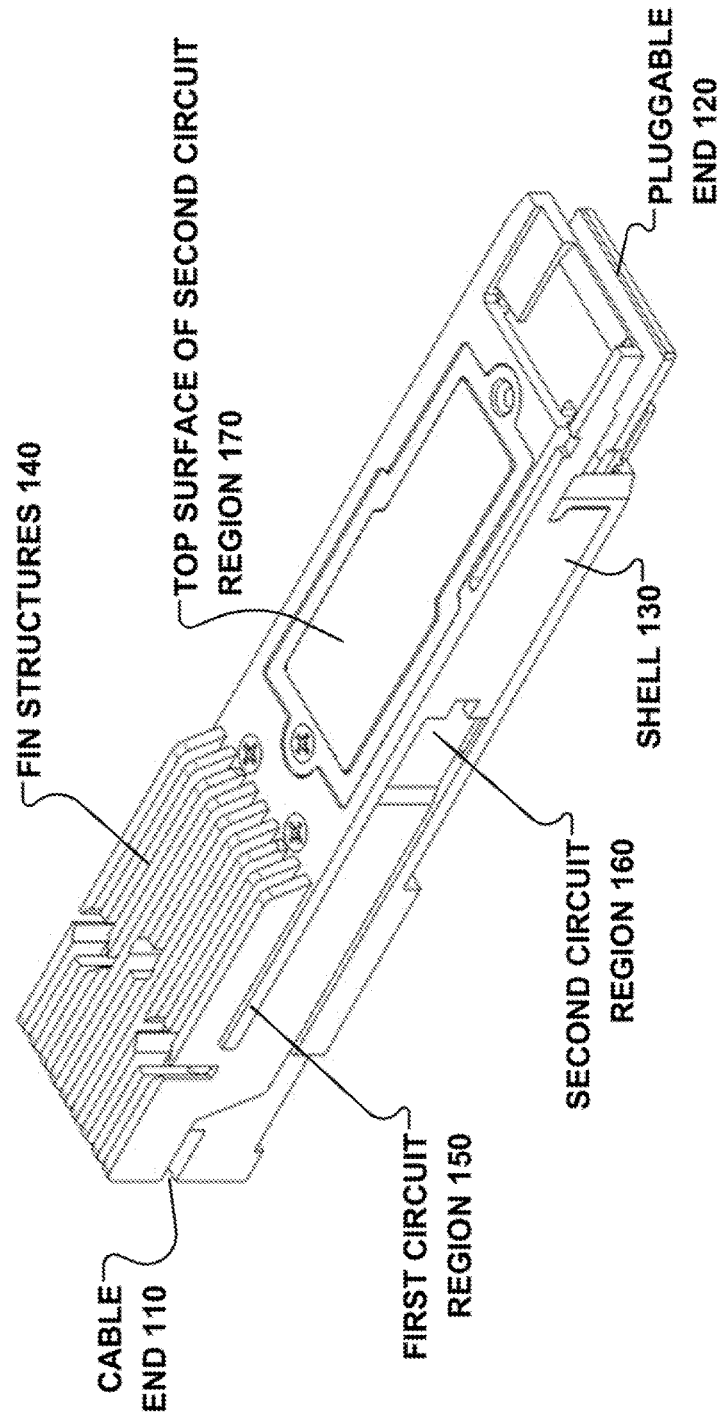
FIG. 1 depicts an example of an optical transceiver device.

FIG. 1 illustrates an example of an optical transceiver device 100. The optical transceiver device 100 includes a transmitter and a receiver (TROSA 420 shown in FIG. 4A). The transmitter in the optical transceiver device 100 may generate an electrical signal at a certain code rate to drive a semiconductor laser (LD) or an optical emitting diode (LED) to emit a modulated optical signal of a corresponding rate through a medium such as a fiber optic cable. The receiver in the optical transceiver device 100 is operable to receive an optical signal input at a certain code rate, and to convert the optical signal to an electrical signal using, for example, a photodetecting diode for further processing.

In general, the optical transceiver device 100 may be configured to transport data between a data-transferring component such as, e.g., a copper or fiber optic cable and an electronic device such as, e.g., a server or network switch. One end of the optical transceiver device 100 can be plugged into a port of the electronic device, and another end connected to the data-transferring component. Because the optical transceiver device 100 operates, in part, as an interface between a data-transferring component and an electronic device, an optical transceiver also may be referred to as a network interface device.

In general, an optical transceiver device 100 can be implemented in various shapes, sizes, and configurations. In some implementations, the optical transceiver device 100 may be a small form-factor pluggable (SFP) device, which is a compact, hot-pluggable network interface module used for both telecommunication and data communications applications. An SFP interface on networking hardware is a modular (plug-and-play) slot for a media-specific transceiver in order to connect a fiber-optic cable or sometimes a copper cable.

Examples of SFP devices include, but are not limited to, a Quad Small Form-factor Pluggable (QSFP) device and a QSFP-DD (QSFP-Double Density). QSFPs include additional lanes relative to other SFPs to support four times faster speeds (e.g., up to 200 Gbit/s) than corresponding SFPs. QSFP-DDs are similar to QSFP but include an additional row of contacts providing for an eight lane electrical interface. QSFP-DD devices can offer double (e.g., up to 400 Gbit/s) the speed of QSFPs. With such high data transfer speeds and dense circuitry supporting the data transfer within the optical transceiver, effective thermal management is desired to prevent overheating, as explained above. This disclosure describes optical transceivers with the capability to dissipate heat effectively through the use of a heat transport structure.

In FIG. 1, the optical transceiver device 100 includes a cable end 110, a pluggable end 120, a shell 130, fin structures 140, a first circuit region 150, and a second circuit region 160. The cable end 110 is connected to the data-transferring component such as, e.g., a copper or fiber optic cable. The cable end 110 may include pads, pin connectors, and/or one or more interfaces to facilitate the connection with the data-transferring component. The pluggable end 120 is configured to be inserted into a cage (not shown in FIG. 1). The pluggable end 120 may include extensions or fingers with mechanical and electrical interfaces configured to be plugged into the cage and coupled to one or more components of the cage.

Housing or shell 130 provides the external structure or skeleton for the optical transceiver device 100 and provides protection to components within the optical transceiver device 100 from external forces and elements. Shell 130 extends from the cable end 110 to the pluggable end 120 and accommodates the internal components of the optical transceiver device 100. In general, the shell may be made of any suitable material such as, e.g., aluminum, zinc, or a combination thereof, that can withstand environmental and thermal fluctuations and provide structural support to internal components of the optical transceiver device 100.

Among the various internal sections of the optical transceiver device 100 are the first circuit region 150 and the second circuit region 160. The first circuit region 150 and second circuit region 160 may include various types of integrated chips (ICs), Application-Specific Integrated Circuits (ASICs), and electronic circuits such as, e.g., controllers, processors such as digital signal processors (DSPs), analog-to-digital converters, digital-to-analog converters, amplifiers, storage devices, filters, and/or photodiodes. One or more circuits connected to the TROSA may be implemented in the first, circuit region 150. The second circuit region 160 is located between the first circuit region 150 and the pluggable end 120.

The optical transceiver device 100 also may include one or more components to facilitate heat management of the optical transceiver. For example, the optical transceiver device 100 may include fin structures 140 to assist in thermal dissipation of the heat load from the first circuit region 150 or TROSA located beneath the fin structures 140, In some implementations, the dimensions (e.g., depth) of the fin structures 140 may conform to the specifications set forth by the Multi-Source Agreement (MSA) issued by the industry-recognized Small Form Factor Committee.

The amount of heat dissipated by the fin structures 140 may depend, at least in part, on the heat generated by the first circuit region 150, the airflow, the ambient temperature, and the depth of the fin structures 140. At times, the fin structures 140 may not be sufficient to transfer heat away from the first circuit region 150. When this situation occurs, components within the optical transceiver device 100 may become structurally and/or functionally damaged. To further facilitate heat management and address the above-noted issue, the optical transceiver device 100 may be coupled to a heat-transferring device such as, e.g., a heat sink, to transfer heat away from one or more circuit regions of the optical transceiver.

FIGS. 2A-2D depict an example coupling of an optical transceiver device 100 and a heat-transferring device 240 in an optical transceiver system. FIG. 2A depicts the optical transceiver device 100 described with respect to FIG. 1. To couple the optical transceiver device 100 to the heat-transferring device 240, a cage 200 may be used.

FIG. 2B depicts an example of the cage 200, which may include, among various other components, a housing or shell 230, a pluggable end 220, and an opening 210. Shell 230 provides the external structure or skeleton to provide structural support and protection to components within the shell 230. The components within the shell 230 provide an interface between the optical transceiver device 100 and the heat-transferring device 240. In some implementations, the design, including thermal and mechanical specifications, of the shell 230 may comply with the specifications of the MSA.

The pluggable end 220 of the cage 200 is configured to be engaged with the optical transceiver device 100. In particular, the pluggable end 220 of the cage 200 may have a first opening to allow the pluggable end 120 of the optical transceiver device 100 to be inserted into the cage 200, as shown in FIGS. 2B and 2C. The pluggable end 220, and more generally the cage 200, may include one or more locking mechanisms such as, e.g., fasteners, that provide resistance to the decoupling of the cage 200 and the optical transceiver device 100 once the cage 200 and the optical transceiver device 100 are coupled together.

Cage 200 may also include a second opening 210 that exposes a cavity within the cage 200. The cavity accommodates the optical transceiver device 100 when inserted into and engaged with the cage 200. When the optical transceiver device 100 is inserted into the cage 200, the second opening 210 exposes a top surface 170 of the second circuit region 160 of the optical transceiver device 100, as shown in FIGS. 2A-(C).

In FIG. 2D, a heat-transferring device 240 is engaged with the cage 200 and the optical transceiver device 100. In general, the heat-transferring device 240 may refer to a passive electronic component configured to transfer heat, generated by an electronic or a mechanical device to another medium, e.g., air, liquid. In some implementations, the heat-transferring device 240 may be a heat sink.

The heat-transferring, device 240 may be mechanically and electrically connected to the cage 200 and/or the optical transceiver device 100 in various configurations. In the implementation depicted in FIG. 2D, a spring-loaded heat-transferring device 240 is disposed on top of the cage 200 and the optical transceiver device 100. The cage 200 provides structural support so that the heat-transferring device 240 can engage with the optical transceiver device 100.

Furthermore, as noted above, the second opening 210 in cage 200 exposes portions of the optical transceiver device 100 when inserted into the cage 200. When the heat-transferring device 240 is disposed on the cage 200, the heat-transferring device 240 may be thermally coupled, directly or indirectly, to the second circuit region 160 through the top surface 170 of the optical transceiver device 100. Through this coupling, heat may be transferred away from the second circuit region 160 and towards the heat-transferring device 240. The heat-transferring device 240 is configured to transfer heat from the second circuit region 160 to the ambient environment, e.g., air, thereby allowing the temperatures of the second circuit region 160 to be managed (e.g., cooled). This heat-transferring device 240 may include one or more fans to direct and control airflow in a particular direction, e.g., from the cable end 110 of the optical transceiver device 100 to an end of the heat-transferring device 240 facing away from the optical transceiver device 100.

In some implementations, additional cooling capacity and elements may be included in the heat-transferring device 240 to provide additional heat relief to the optical transceiver device 100. In some implementations, the cage 200 and heat-transferring device 240 are assembled into a rack box.

As explained above with respect to FIGS. 1 and 2, the optical transceiver device 100 may include fin structures 140 or may be coupled to heat-transferring devices, such as device 240, to manage heat. However, as the density of integrated chips and circuits increases and the demands for greater bandwidth and speed in optical transceivers increases, fin structure 140 and/or heat-transferring device 240 may not provide optimum thermal performance or the most effective heat transfer solutions.

For example, referring to FIG. 1, fin structure 140 has limited surface, contact area with first circuit region 150 and may be inadequate to dissipate the heat generated by the first circuit region 150. Heat-transferring device 240 is not as effective in transferring heat from the first circuit region 160, because, in some instances, heat generated by the second circuit region 160 can be several (e.g. to three) times that of the heat generated by the first circuit region 150, thereby negating the ability of the heat-transferring device 240 to cool the first circuit region 150. This issue may occur, for example, in optical transceiver device 100 configurations in which the second circuit region 160 has one or more digital signal processors or ASICs operating, which can generate significant amounts of heat. More generally, this issue in transferring heat may arise when heat from a source region is to be transferred to the heat-transferring device 240, but an intervening region (e.g., the second circuit region 160 with a running DSP) in the path between the source region and the heat-transferring device 240 generates more heat than surrounding regions and/or the source region.

In addition, in the past, optical transceivers generally have consumed smaller amounts of power so that additional heat sinking to remove excess heat was not required. In the newer and upcoming generation of optical transceivers, greater power, e.g., more than 20 Watts of power, may be used and may entail additional heat sinking, moving air, and moving or transferring heat from one location to another.

Figure 3:
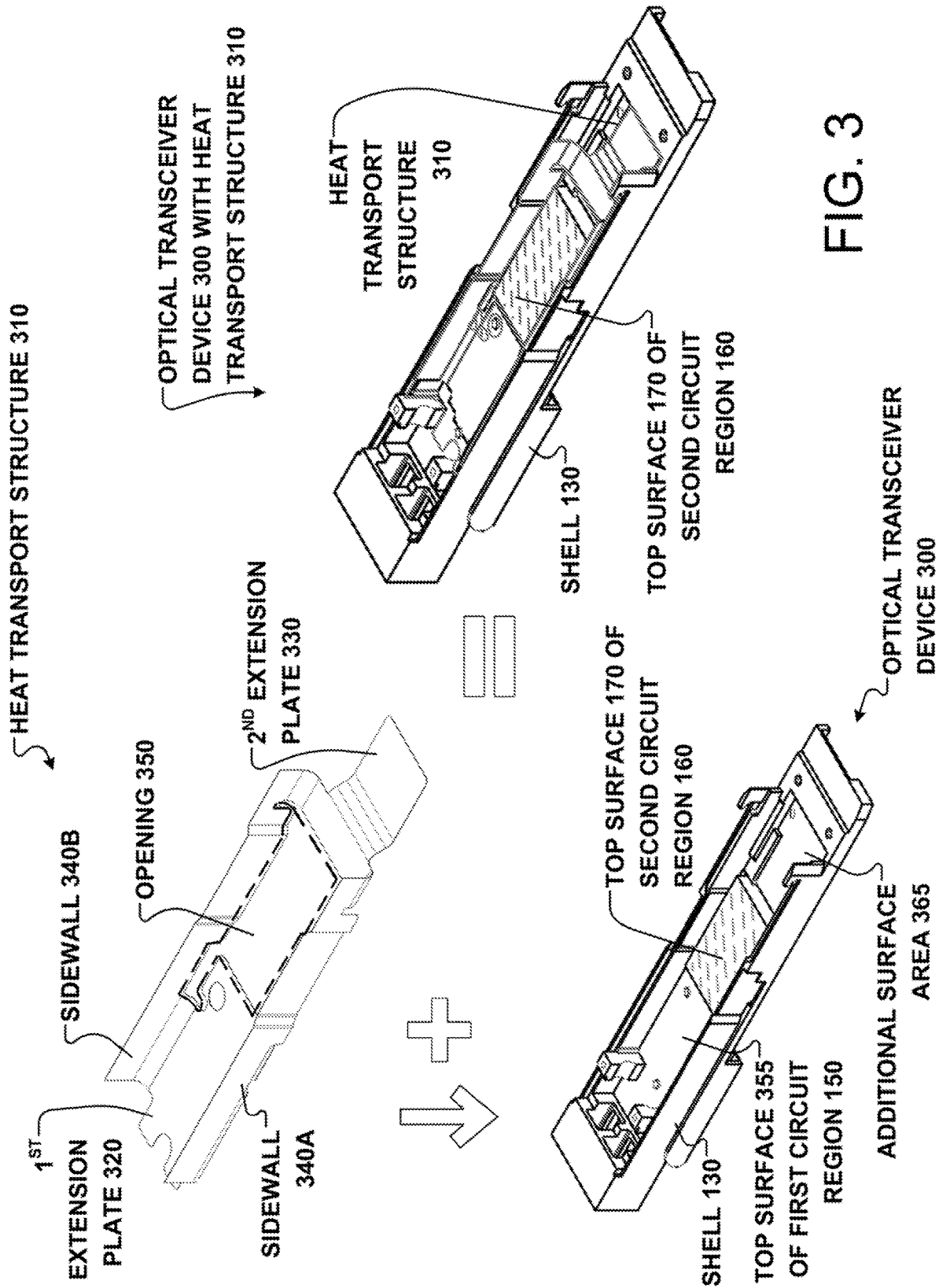
FIG. 3 depicts an example of a heat transport structure that provisions heat transfer from an optical transceiver device to a heat-transferring device.

To address the issue of intervening elements or interferences compromising heat transfer in optical transceivers and to provide additional mechanisms for performing heat transfer, a heat transport structure 310, as shown in FIG. 3, may be implemented in the optical transceiver device 300. The optical transceiver device 300 in FIG. 3 is similar to the optical transceiver device 100 shown in FIG. 1 but does not show the fin structures 140 and TROSA. The heat transport structure 310 may be made of a highly conductive structure such as, e.g., a graphite tape, heat piping, or a vapor chamber. The heat transport structure 310 may include, one or more of each of the graphite tape, heat piping, and a vapor chamber, or any combination of the three. In some implementations, the heat transport structure 310 may include a thermally conductive structure or an anisotropic conductive material such that conductivity can be directed in a particular direction. For example, the conductivity can be directed from a desired source circuit region to the heat-transferring device 240.

The heat transport structure 310 may be configured in various different suitable ways depending on the design of the optical transceiver device 300 and the region(s) of the optical transceiver device 300 from which heat relief is desired. For illustrative purposes, the following examples describe implementations in which heat is to be transferred from the first circuit region 150 of optical transceiver device 300 to the heat-transferring device 240.

FIG. 3 illustrates one example of a heat transport structure 310 being disposed on the optical transceiver device 300 to facilitate with heat management of the optical transceiver device 300. The heat transport structure 310 provides a path bypassing the second circuit region 160 and allowing heat to be transferred from the first circuit region 150, around the second circuit region 160, and to the heat-transferring device 240. The heat transport structure 310 may include one or more plates connected to each other to form an integrated structure. In particular, the heat, transport structure 310 includes a first extension plate 320, a second extension plate 330, and sidewalls 340A, 340B. The heat transport structure 310 also includes an opening 350 forming a gap in the heat transport structure 310.

As shown in FIGS. 1 and 3, a top surface 355 of the first circuit region 150 is located closer to the cable end 110 of the optical transceiver device 300. The second circuit region 160 and top surface 170 thereof are located between the first circuit region 150 and the pluggable end 120 that is coupled to the heat-transferring device 240. The optical transceiver device 300 may also include additional surface area 365 that is not located directly above second circuit region 160 but may be coupled to the heat-transferring device 240 to provide additional heat transfer to the heat-transferring device 240.

The heat transport structure 310 is disposed on the optical transceiver device 300 to optimize heat transfer from the first circuit region 150 to the heat-transferring device 240. To accomplish this, the first extension plate 320 of the heat transport structure 310 may be disposed above and in parallel to the horizontal top surface 355 of the first circuit, region 150 while extending towards the cable end 110 of the optical transceiver device 300. The first extension plate 320 may be directly or indirectly coupled to the first circuit region 150, For example, the first extension plate 320 may directly contact a conductive circuit element such as a wire, heat pipe, or metal contact of the first circuit region 150 so that heat from the first circuit region 150 may transfer to the first extension plate 320. A compressive force may be applied to the first extension plate 320 to ensure strong direct contact between the first circuit region 150 and the first extension plate 320. The direct contact enables heat from the first circuit region 150 to transfer to the first extension plate 320 thereby resulting in a reduction of heat in the first circuit region 150. The first extension plate 320 may also be connected to TROSA 420 (described further with respect to FIG. 4A) through application of the compressive force.

The sidewalls 340A, 340B are structures that extend from at least a portion of the first extension plate 320 to at least a portion of the second extension plate 330. The sidewalls 340A, 340B are vertical structures configured to fit along the sidewalls of the optical transceiver device 300. One or more curved structures may be used to connect the sidewalls 340A, 340B to horizontal portions of the optical transceiver device 300 such as, e.g., the first extension plate 320 or the second extension plate 330. Accordingly, the sidewalls 340A, 340B may include angles and turns parallel to the angles and turns of the sidewalls of the optical transceiver device 300.

Sidewall 340A is separated from sidewall 340B by a width of the first extension plate 320 or the second extension plate 330. The width may be slightly less than a width of the optical transceiver device 300 to enable the heat transport structure 310 to fit on a surface of the optical transceiver device 300 between the sidewalls of the optical transceiver device 300.

The heat transport structure 310 also includes an opening 350, which is formed between the two sidewalls 340A, 340B and between the first extension plate 320 and the second extension plate 330. In general, the heat transport structure 310 may include one or more openings (including opening 350) that correspond to regions of the optical transceiver device 300 from which heat is not desired to be transferred to the heat transport structure 310. Because of such openings, there is no contact between the heat transport structure 310 and any such region of the optical transceiver device 300 from which heat is not desired to be transferred.

In the example shown in FIG. 3, the heat transport structure 310 is aligned and placed onto the optical transceiver device 300 such that the opening 350 is directly above the second opening 210 and the top surface 170 of the second circuit region 160. Due to the opening 350, the heat transport structure 310 does not contact the second circuit region 160, and heat is not thermally conducted from the second circuit region 160 through the heat transport structure 310. Instead, the sidewalls 340A, 340B stretch along the surface 170 of the second circuit region 160 without touching the surface 170 and provide a conductive path from the first extension plate 320 to the second extension plate 330 without any thermal interference from the second circuit region 160.

The second extension plate 330 extends towards the pluggable end 120 of the optical transceiver device 300. The second extension plate 330 is disposed above and in parallel to the horizontal additional surface area 365 of the optical transceiver device 300 and below the heat-transferring device 240. In some implementations, the bottom surface of the second extension plate 330 is directly in contact with the additional surface area 365 and the top surface of the second extension plate 330 is directly in contact with the heat-transferring device 240. By virtue of the contact with the heat-transferring device 240, the second extension plate 320 may enable heat to be transferred from the first extension plate 330 to the heat-transferring device 240. In addition, the second extension plate 320 may also facilitate heat transfer from other regions of the optical transceiver device 300 through the additional area 365.

In some implementations, the second extension plate 330 and the first extension plate 320 may be disposed at different horizontal planes or elevation levels from each other. In general, the elevation levels may be determined by the design of the optical transceiver device 300 such that the heat transport structure 310 can be a placed on a top surface of the optical transceiver device 300 and aligned to expose the top surface 170 of the second circuit region 160, the top surface 355 of the first circuit region 150, and the additional surface area 365. In the example shown in FIG. 3, the second extension plate 330 is formed at a height lower than the height of the first extension plate 320.

Figures 4A, 4B:
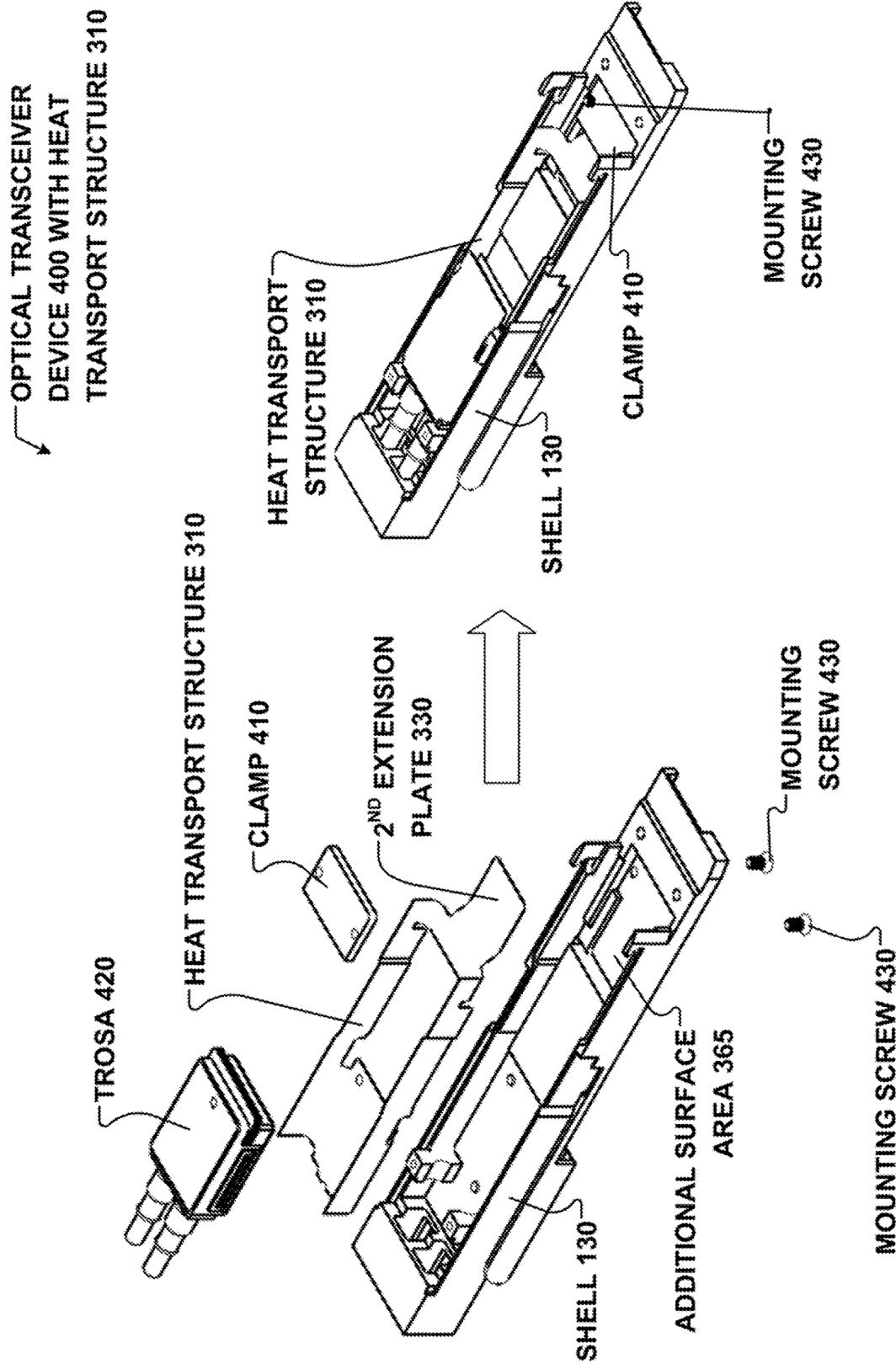
FIG. 4A depicts an exploded view of a configuration in which a clamp is used to facilitate heat transfer from the optical transceiver device to the heat transport structure.
FIG. 4B depicts another view of the optical transceiver device shown in FIG. 4A.

Referring to FIGS. 4A and 4B, in some implementations, a clamp 410 may additionally be disposed on the second extension plate 330. FIGS. 4A and 4B depict an optical transceiver device 400 like the optical transceiver device 300 of FIG. 3 but additionally includes the TROSA 420, clamp 410, and mounting screws 430. FIG. 4A depicts an exploded view, and FIG. 4B depicts a view of the optical transceiver device 400 as an integrated device.

The heat transport structure 310 may be disposed above the shell 130 of the optical transceiver device 400 as described above with respect to FIG. 3. Clamp 410 may provide an additional mechanism to secure or clamp the heat transport structure 310 to the optical transceiver device 400. Clamp 410 may be disposed directly on the second extension plate 330 and beneath the heat-transferring device 240. In this manner, clamp 410 can provide a compressive force that enables a strong contact between the heat transport structure 310 the additional surface area 365, and the heat-transferring device 240.

In some implementations, clamp 410 may be a conductive block configured to provide mechanical latching to the optical transceiver device 400. For example, the clamp 410 may be an aluminum block. In general, the clamp 410 may be formed of any suitable thermally conductive material. Various suitable mounting screws 430 may also be used. In some cases, the mounting screws 430 may be screwed in from a bottom side of shell 150, and, in some cases, the mounting screws 430 may be screwed in from a top side of shell 130.

As explained above, TROSA 420 may include the receiver and transmitter of the optical transceiver device 400. The TROSA 420 may be electrically connected to the first circuit region 150. The TROSA 420 is disposed above the first contact region 150 with the heat transport structure 310 interposed between the TROSA 420 and the first contact region 150, Although not shown in FIGS. 4A and 48, additional fin structures may be disposed above TROSA 420, as shown in FIG. 1, to facilitate with heat management of the optical transceiver device 400.

While this specification contains many specifics, these should not be construed as limitations on the scope of the disclosure or of what may be, claimed, but rather as descriptions of features specific to particular implementations. Certain features that are described in this specification in the context of separate implementations may also be combined. Conversely, various features that are described in the context of a single implementation may also be implemented in multiple implementations separately or in any suitable subcombination. Moreover, although features may be described above as acting in certain combinations and may even be claimed as such, one or more features from a claimed combination may, in some cases, be excised from the combination, and the claimed combination may be directed to a sub-combination or variation of a sub-combination. For example, although the mapping operation is described as a series of discrete operations, the various operations may be divided into additional operations, combined into fewer operations, varied in order of execution, or eliminated, depending on the desired implementation. Similarly, the separation of various system components in the implementations described above should not be understood as requiring such separation in all implementations.

Terms used herein and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together. The term "and/or" is also intended to be construed in this manner.

The use of the terms "first," "second," "third," etc., are not necessarily used herein to connote a specific order or number of elements. Generally, the terms "first," "second," "third," etc., are used to distinguish between different elements as generic identifiers. Absent a showing that the terms "first" "second," "third," etc., connote a specific order, these terms should not be understood to connote a specific order. Furthermore, absence a showing that the terms "first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

What is claimed is:

1. A system comprising:
a heat-transferring device configured to transfer heat away from one or more circuits;
a network interface module configured to be coupled to the heat-transferring device and comprising:
a first circuit region, and
a second circuit region located between the first circuit region and the heat-transferring device; and
a thermally conductive structure configured to be coupled to the first circuit region and to the heat-transferring device and configured to transfer heat from the first circuit region to the heat-transferring device without contacting the second circuit region,
wherein:
the network interface module comprises a shell to accommodate the first circuit region and the second circuit region; and
the thermally conductive structure is disposed along a first horizontal portion of the shell under which the first circuit region is located and along a second horizontal portion of the shell coupled to the heat-transferring device.

2. The system of claim 1, wherein:
when the thermally conductive structure is coupled to the first circuit region and to the heat-transferring device, the thermally conductive structure is not disposed above or below an area where the second circuit region is located.

3. The system of claim 1, wherein:
the thermally conductive structure is disposed along a vertical wall of the shell that is proximate to the second circuit region to bypass the second circuit region such that the thermally conductive structure does not contact the second circuit region.

4. The system of claim 1, wherein:
the thermally conductive structure comprises a pair of vertical walls disposed along the first circuit region and the second circuit region, the pair of vertical walls transferring heat from the first horizontal portion to the heat-transferring device.

5. The system of claim 4, wherein:
the thermally conductive structure comprises curved surfaces to connect the pair of vertical walls to the first horizontal portion and the second horizontal portion.

6. The system of claim 1, wherein the thermally conductive structure is not thermally coupled to the second circuit region.

7. The system of claim 1, wherein:
the thermally conductive structure comprises a heat pipe or an anisotropic conductive material;
the second circuit region comprises a digital signal processing circuit;
the heat-transferring device comprises a heat sink; and
the network interface module comprises a quad small form factor pluggable double density device.

8. The system of claim 1, wherein the thermally conductive structure comprises graphite tape.

9. The system of claim 1, wherein:
the first circuit region is coupled to a fin structure configured to dissipate heat from a circuit element in the first circuit region; and
the second circuit region comprises a digital signal processing circuitry and is operable to generate a larger amount of heat than the first circuit region.

10. The system of claim 1, further comprising:
a cage configured to accommodate the heat-transferring device and to engage with the network interface module when the network interface module is coupled to the heat-transferring device.

11. The system of claim 1, further comprising:
a mechanical clamp disposed between the thermally conductive structure and the heat-transferring device, the mechanical clamp configured to clamp the thermally conductive structure to the network interface module.

12. The system of claim 11, wherein the mechanical clamp comprises aluminum.

13. The system of claim 1, wherein:
the thermally conductive structure includes a plate, an opening, and a first extension portion and a second extension portion that extend from the plate such that the heat is transferred from the plate, through the first extension portion and the second extension portion, to the heat-transferring device, and
the opening is formed between the first extension portion and the second extension portion.

* * * * *